(12) United States Patent
Lee

(10) Patent No.: US 8,092,052 B2
(45) Date of Patent: Jan. 10, 2012

(54) LIGHT EMITTING DIODE PACKAGE FOR PROJECTION SYSTEM

(75) Inventor: Jae Hong Lee, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 228 days.

(21) Appl. No.: 12/415,395

(22) Filed: Mar. 31, 2009

(65) Prior Publication Data

US 2009/0243458 A1 Oct. 1, 2009

(30) Foreign Application Priority Data

Mar. 31, 2008 (KR) .................. 10-2008-0029969

(51) Int. Cl.
*F21V 5/00* (2006.01)
(52) U.S. Cl. ............... 362/311.02; 362/294; 362/311.14
(58) Field of Classification Search ............ 362/249.02, 362/311.01, 311.02, 311.05, 311.14, 294, 362/373; 257/98, 99, 89
See application file for complete search history.

(56) References Cited

U.S. PATENT DOCUMENTS

| 7,592,638 B2 * | 9/2009 | Kim ............................... 257/99 |
| 7,595,513 B2 * | 9/2009 | Plank et al. ..................... 257/98 |
| 7,800,124 B2 * | 9/2010 | Urano et al. .................... 257/98 |
| 2008/0023722 A1 * | 1/2008 | Lee et al. ........................ 257/99 |
| 2009/0078950 A1 * | 3/2009 | Sun ................................. 257/98 |
| 2009/0272990 A1 * | 11/2009 | Sun et al. ........................ 257/98 |

* cited by examiner

*Primary Examiner* — Y My Quach Lee
(74) *Attorney, Agent, or Firm* — H.C. Park & Associates, PLC

(57) ABSTRACT

A light emitting diode (LED) package for a projection system is provided, which includes a package body having an inner space formed therein and having an open upper portion; and an LED chip mounted onto a bottom of the package body, wherein the package body includes a socket coupling portion formed around the upper portion of the package body to have a certain corresponding thickness and height allowing the socket coupling portion to be inserted into the socket of the optical engine.

14 Claims, 4 Drawing Sheets

LIGHT EMITTING DIODE PACKAGE FOR PROJECTION SYSTEM

CROSS-REFERENCE TO RELATED APPLICATION

This application claims priority from and the benefit of Korean Patent Application No. 10-2008-0029969, filed on Mar. 31, 2008, which is hereby incorporated by reference for all purposes as if fully set forth herein.

BACKGROUND OF THE INVENTION

1. Field of the Invention

The present invention relates to a light emitting diode (LED) package for a projection system, and more particularly, to an LED package for a projection system that provides a light source in an optical engine provided in the projection system.

2. Discussion of the Background

A variety of projection systems require optical engines as sources of light. Recent applications include an LED package used as a light source in a small projection system.

FIG. 1 depicts a conventional LED package utilized in a projection system.

Referring to FIG. 1, a conventional LED package for a projection system includes a package body 1, and an inner space 2 for mounting an LED chip (not shown) provided in the package body 1. Typically, an LED chip is mounted on the bottom of the inner space 2, and then, the inner space 2 is filled with a molding material to cover and protect the LED chip.

In this configuration, however, the package body 1 has an upper surface of quadrangular shape, with no structure for coupling with a socket (not shown) of an optical engine provided in the projection system. Thus, the structure of the conventional LED package 1 makes it difficult for the LED package 1 to be attached to the optical engine. Moreover, although the conventional LED package can be attached to a socket of an optical engine with difficulty, the connection achieved does not provide a close, snug fit between the LED package and the socket, permitting light generated by the LED package to leak through openings between the LED package 1 and the socket because of the poor connection between the LED package 1 and the socket.

Another drawback of the conventional LED package 1 is that since the entire inner space 2 is filled with a molding material, light is propagated through all of the molding material occupying space 2. Since the light is being emitted through this relatively large area, the efficiency of the optical engine is thereby reduced.

SUMMARY OF THE INVENTION

This invention provides an LED package configured to be more easily attached to an optical engine of a projection system and which emits light with reduced optical loss.

Additional features of the invention will be set forth in the description which follows, and in part will be apparent from the description, or may be learned by practice of the invention.

The present invention discloses an LED package for a projection system, which includes a package body having an inner space formed therein and having an open upper portion and an LED chip mounted onto a bottom of the package body, wherein the package body includes a socket coupling portion that permits the socket coupling portion of the LED package to be coupled with the socket of the optical engine.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
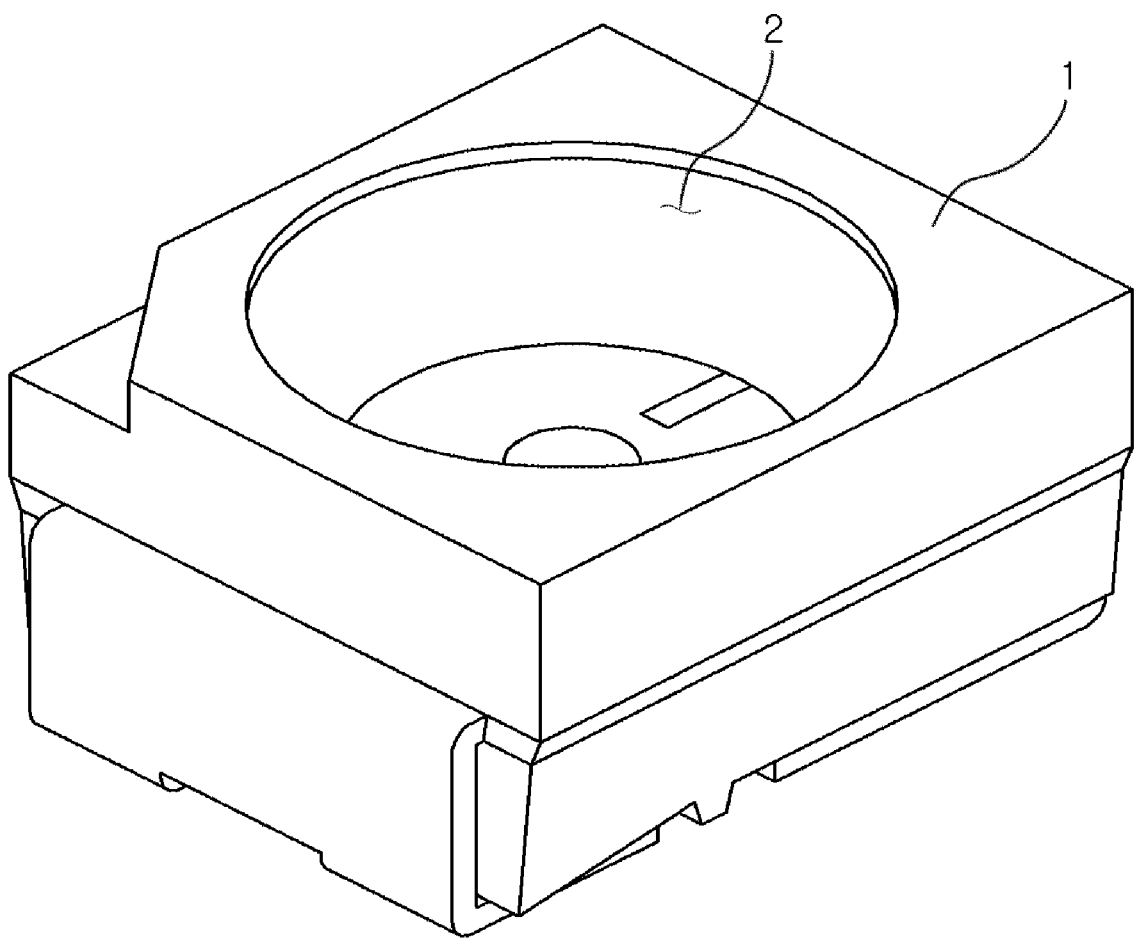
FIG. 1 shows a conventional LED package for a projection system.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
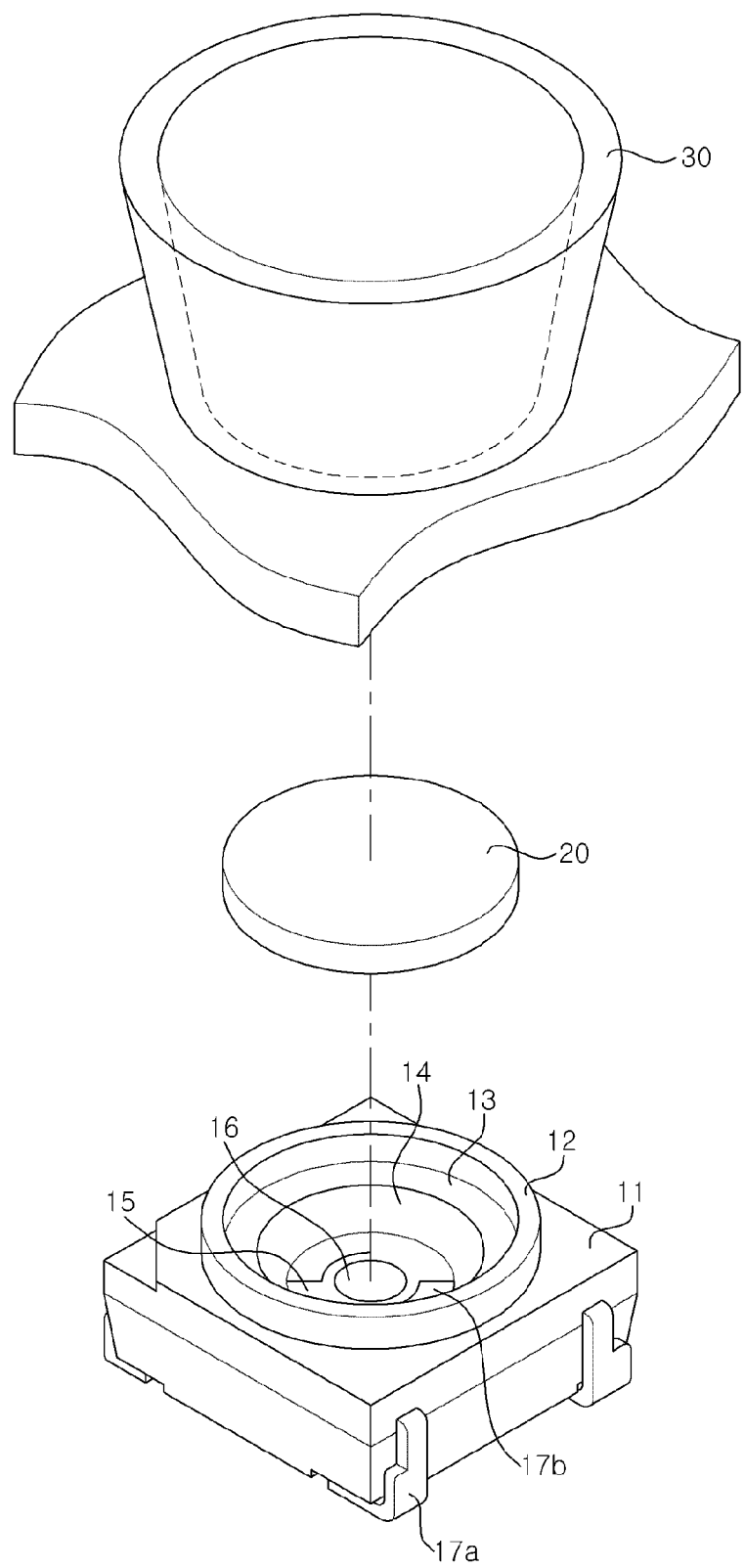
FIG. 2 is a perspective view showing an LED package for a projection system according to an exemplary embodiment of the present invention.

Exemplary embodiments of the present invention will now be described with reference to FIG. 2, FIG. 3 and FIG. 4. FIG. 2 is a perspective view showing an LED package for a projection system according to an exemplary embodiment of the present invention, FIG. 3 is a plan view showing the LED package for a projection system according to an exemplary embodiment of the present invention, and FIG. 4 is a perspective view showing an LED package for a projection system according to an embodiment of the present invention coupled to a socket of an optical engine.

Figure 3:
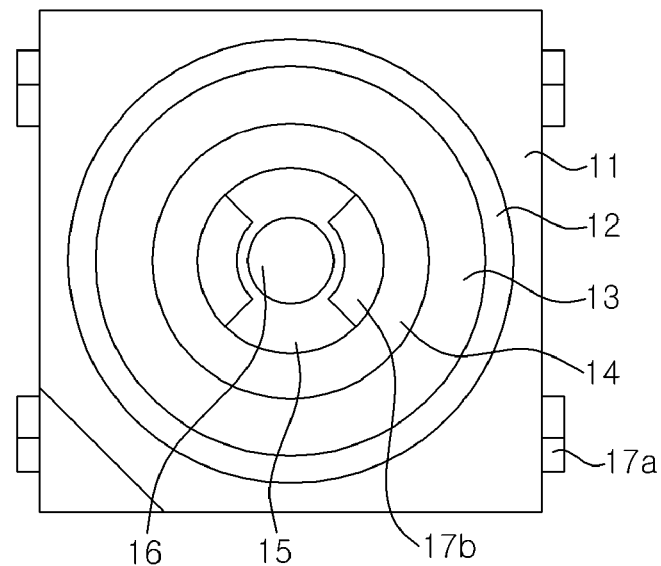
FIG. 3 is a plan view showing an LED package for a projection system according to an exemplary embodiment of the present invention.
Figure 4:
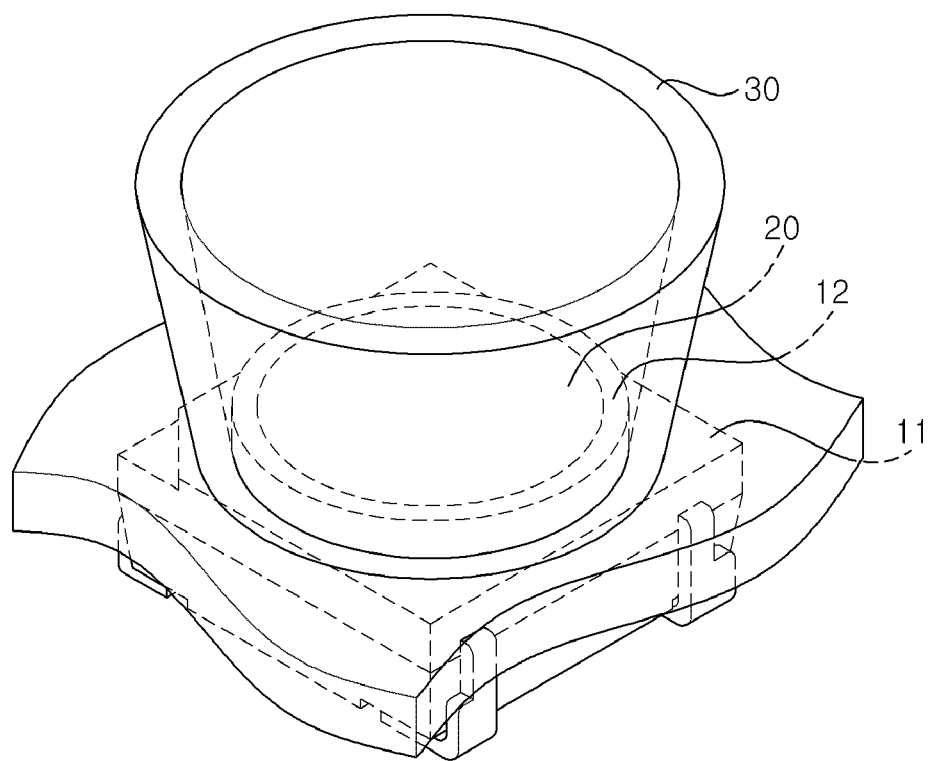
FIG. 4 is a perspective view showing an LED package for a projection system according to an exemplary embodiment of the present invention coupled to a socket of an optical engine.
Figure 5:
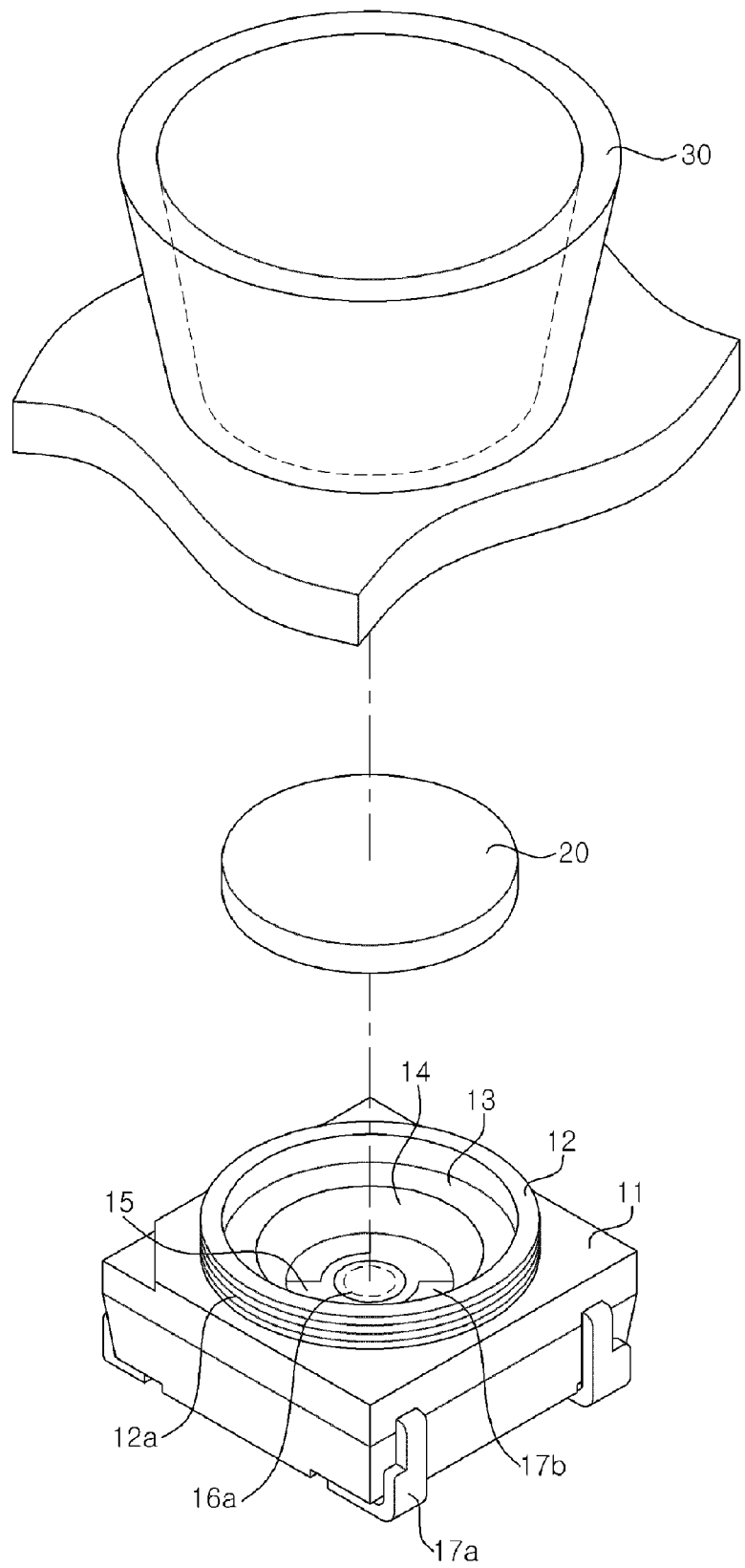
FIG. 5 is a perspective view showing an LED package for a projection system according to an exemplary embodiment of the present invention.

As shown in FIG. 2, FIG. 3 and FIG. 4, an LED package for a projection system according to one embodiment of the present invention includes a package body 11 having an inner space where an LED chip (not shown) may be installed. The inner space of the package body 11 is open in a direction in which light may be emitted. The package body 11 may be formed by molding and sintering a ceramic material or injection-molding a plastic resin. A heat sink 16 may be inserted and installed in the inner space of the package body 11. Alternatively, as shown in FIG. 5, the heat sink 16 may be replaced with a heat pipe 16a.

A lead frame including outer leads 17a and inner leads 17b is installed in the package body 11. The inner leads 17b of the lead frame are located around the heat sink 16 and within the package body 11, and outer leads 17a of the lead frame are connected to the inner leads 17b and extend to an exterior portion of the package body 11.

A lower portion of the heat sink 16 is exposed to the exterior of the package body 11 through an open bottom portion of the package body 11, such that the heat sink 16 can easily discharge the heat from the LED chip (not shown) to the exterior of the package body 11. With the heat sink 16 installed, the open bottom portion of the package body 11 is closed by the lower portion of the heat sink 16, while the upper portion of the package body 11 is open to permit light to be emitted through a lens. In practice, the LED chip (not shown) is attached to and supported by an upper end of the heat sink 16.

The LED chip (not shown) may be a common LED chip providing light, such as a lateral-type LED chip, for example, in which bonding pads are located on an upper surface of the chip, or a vertical-type LED chip in which bonding pads are respectively located on upper and lower surfaces of the LED chip. After the LED chip is attached to the upper end of the heat sink 16, the LED chip may be dotted with a molding material that includes a fluorescent substance. The fluorescent substance may include various kinds of substances, which may permit light to be emitted therefrom which, when mixed with the light emitted from the LED chip, is used to create white light.

The LED chip is electrically connected to the inner leads 17b of the lead frame through bonding wires (not shown). The bonding wires are respectively bonded and connected to electrodes of the LED chip (not shown) with opposite polarities and are also connected to the inner leads 17b of the lead frame.

In this embodiment, the LED package body 11 includes a reflector arranged on the heat sink 16 which serves as a member supporting the LED chip. The reflector reflects light emitted from the LED chip at a predetermined angle. The reflector includes a bottom 15 and a side reflecting portion 14 slantingly extending from the bottom 15. The reflector may be made of a metallic material with excellent reflectivity, or made of a non-metallic material such as a resin the entire surface of which is coated with metal, or formed by coating only the side reflecting portion 14 of the reflector with metal. An opening is formed in the bottom 15 of the reflector to permit insertion of the heat sink 16 therein.

A socket coupling portion 12 to be inserted into and coupled to a socket 30 of the optical engine is formed such that it protrudes from the upper portion of the package body 11. The socket coupling portion 12 is formed on the package body 11 to have a certain complimentary thickness, height and a shape corresponding to socket 30 that allows the socket coupling portion 12 to be inserted into and coupled to the socket 30 of the optical engine. Moreover, the socket coupling portion 12 may be shaped corresponding to the socket 30 of the optical engine. For example, the socket coupling portion 12 may have a circular or rectangular shape corresponding to a circular or rectangular shape of the socket 30.

The socket coupling portion 12 may include a fastener 12a to permit coupling of the package body 11 to the socket 30 of the optical engine, as shown in FIG. 5. For example, a thread may be formed on an outer or inner side of the socket coupling portion 12. Alternatively, a fastening structure, which the socket 30 of the optical engine can be inserted into and fastened to, may be formed on the outer or inner side of the socket coupling portion 12. In addition, the inner side of the socket coupling portion 12 may be coated with a reflection film. Thus, the light generated from the LED chip can be reflected by the reflection film and effectively emitted from the package body 11.

A lens seating portion 13 is formed on an inner side of the socket coupling portion 12 such that a non-reflecting glass lens 20 may be seated on the upper portion of the package body 11. The lens seating portion 13 is flat and formed on the package body 11 to correspond to the shape of the non-reflecting glass lens 20.

The non-reflecting glass lens 20 is seated on the lens seating portion 13 and attached to the socket coupling portion 12 of the package body 11. The non-reflecting glass lens 20 enable light to be emitted from the LED chip with constant transmissivity, thereby enhancing reliability. In this regard, the non-reflecting glass lens 20 may be made of non-reflecting glass with a high transmissivity value. Also, the non-reflecting glass lens 20 may be obtained by coating high transmission glass with an anti-reflective coating. The anti-reflective coating process includes applying a coating to the glass lens in a deposition process that raises the average reflexibility of the glass lens in a specific wavelength range to a value higher than the reflexibility of the non-coated glass lens. An upper surface of the non-reflection glass lens 20 may be flat or have a certain curvature.

The LED package according to an embodiment of the present invention is assembled by mounting the LED chip (not shown) to the bottom of the package body 11 and then inserting and attaching the non-reflecting glass lens 20 to the lens seating portion 13 of the package body 11. Thereafter, the assembled LED package is inserted into and coupled with the socket 30 of the optical engine by the socket coupling portion 12 formed on the upper portion of the package body 11 to achieve a close fit. The socket 30 of the optical engine is adapted to project light emitted from the LED package. The close fit achieved by coupling the LED package to the socket 30 of the optical engine through the socket coupling portion 12 formed on the upper portion of the LED package, reduces the distance between the LED chip mounted in the LED package and the socket 30 of the optical engine, thereby confining the emitted light to a smaller area, preventing the leakage of light and thereby improving the optical efficiency of the LED package.

Thus, according to an exemplary embodiment of the present invention, a socket coupling portion 12 of a package body 11 permits coupling of an LED package with the socket 30 of an optical engine whereby an LED package can be more easily and closely attached to the optical engine than is conventionally possible. Moreover, a non-reflective glass lens is used to protect the LED chip contained within the LED package instead of a molding material, thereby enhancing the optical efficiency of the device relative to conventional applications.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light emitting diode (LED) package for a projection system, comprising:

a package body comprising an inner space formed therein and an open upper portion; and an LED chip mounted onto a bottom portion of the package body, wherein the package body comprises a socket coupling portion for detachably coupling an outside surface of the socket coupling portion to an inside surface of a socket of an optical engine having an open upper end portion and the socket at a bottom end portion for detachably coupling with the socket coupling portion.

2. The LED package as claimed in claim 1, wherein the socket coupling portion is formed around the upper portion of the package body with a thickness and height corresponding to the socket of the optical engine.

3. The LED package of claim 1, wherein the socket coupling portion has a shape corresponding to the socket of the optical engine.

4. The LED package of claim 1, wherein the socket coupling portion comprises a fastener that couples the package body to the socket of the optical engine.

5. The LED package of claim 1, wherein the socket coupling portion comprises a reflective film on an inner side thereof.

6. The LED package of claim 1, further comprising a non-reflective glass lens inserted into the upper portion of the package body to protect the LED chip.

7. The LED package of claim 6, wherein a lens seating portion is formed on an inner side of the socket coupling portion such that the non-reflective glass lens is seated on the upper portion of the package body.

8. The LED package of claim 1, wherein the package body further comprises an open bottom.

9. The LED package of claim 8, further comprising a heat sink disposed in the inner space of the package body and exposed to an exterior portion of the package body through the open bottom, wherein the heat sink occupies the open bottom and dissipates heat through the open bottom to the exterior portion of the package body.

10. The LED package of claim 1 wherein a heat pipe is placed in the inner space of the package body to dissipate heat away from the package body.

11. The LED package of claim 1, wherein the open upper portion comprises a diameter smaller than any diameter of the socket coupling portion.

12. The LED package of claim 1, wherein the outside surface of the socket coupling portion is on an opposite side of the socket coupling portion from the package body open upper portion.

13. The LED package of claim 1, wherein a bottom surface of the socket directly contacts a surface of the package body adjacent to the socket coupling portion.

14. The LED package of claim 1, wherein the socket coupling portion comprises a single inner diameter.

\* \* \* \* \*